United States Patent [19]
Hattori et al.

[11] Patent Number: 5,148,035
[45] Date of Patent: Sep. 15, 1992

[54] POSITION DETECTING METHOD AND APPARATUS

[75] Inventors: Jun Hattori, Zama; Shigeyuki Suda, Yokohama, both of Japan

[73] Assignee: Canon Kabushiki Kaisha, Tokyo, Japan

[21] Appl. No.: 789,630

[22] Filed: Nov. 12, 1991

Related U.S. Application Data

[63] Continuation of Ser. No. 692,975, Apr. 29, 1991, abandoned, which is a continuation of Ser. No. 403,881, Sep. 7, 1989, abandoned.

[30] Foreign Application Priority Data

Sep. 9, 1988 [JP] Japan ............................ 63-225803
Aug. 14, 1989 [JP] Japan ............................ 1-209924

[51] Int. Cl.$^5$ ............................................ G01N 21/86
[52] U.S. Cl. ................................. 250/548; 356/401
[58] Field of Search ............... 250/548, 557; 356/400, 356/401

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/172 |
| 4,360,273 | 11/1982 | Thaxter | 356/354 |
| 4,398,824 | 8/1983 | Feldman et al. | 356/401 |
| 4,514,858 | 4/1985 | Novak | 378/34 |
| 4,539,482 | 9/1985 | Nose | 250/578 |
| 4,545,683 | 10/1985 | Markle | 356/400 |
| 4,636,626 | 1/1987 | Hazama | 250/557 |
| 4,656,347 | 4/1987 | Une | 250/548 |
| 4,662,753 | 5/1987 | Yabu | 356/401 |
| 4,701,050 | 10/1987 | Oshida | 250/548 |
| 4,812,661 | 3/1989 | Owen | 250/491.1 |
| 4,870,289 | 9/1989 | Sato | 250/548 |

FOREIGN PATENT DOCUMENTS 3727453 3/1988 Fed. Rep. of Germany .
56-157033 12/1981 Japan .
61-111402 5/1986 Japan .

OTHER PUBLICATIONS

Feldman, et al., "Application of Zone Plates to Alignment in X-ray Lithography," Optical Engineering, vol. 22, Mar.-Apr. 1983, pp. 203-207.

Primary Examiner—David C. Nelms
Attorney, Agent, or Firm—Fitzpatrick, Cella, Harper & Scinto

[57] ABSTRACT

A device for detecting a positional relationship between opposed first and second objects, with respect to a first direction perpendicular to the opposing direction. The device includes a light source for projecting light to the first and second objects, a photodetecting portion for receiving light from one of the first and second objects irradiated with the light from the light source, the photodetecting portion being operable to detect a predetermined parameter related to the light, which parameter is changeable with the positional relationship between the first and second objects with respect to the first direction, a first position detecting system for detecting a positional relationship between the first and second objects, with respect to a second direction perpendicular to the opposing direction of the first and second objects and having an angle with respect to the first direction, and a second position detecting system for detecting the positional relationship between the first and second objects with respect to the first direction, on the basis of the detection by the photodetecting system and the first position detecting system.

19 Claims, 9 Drawing Sheets

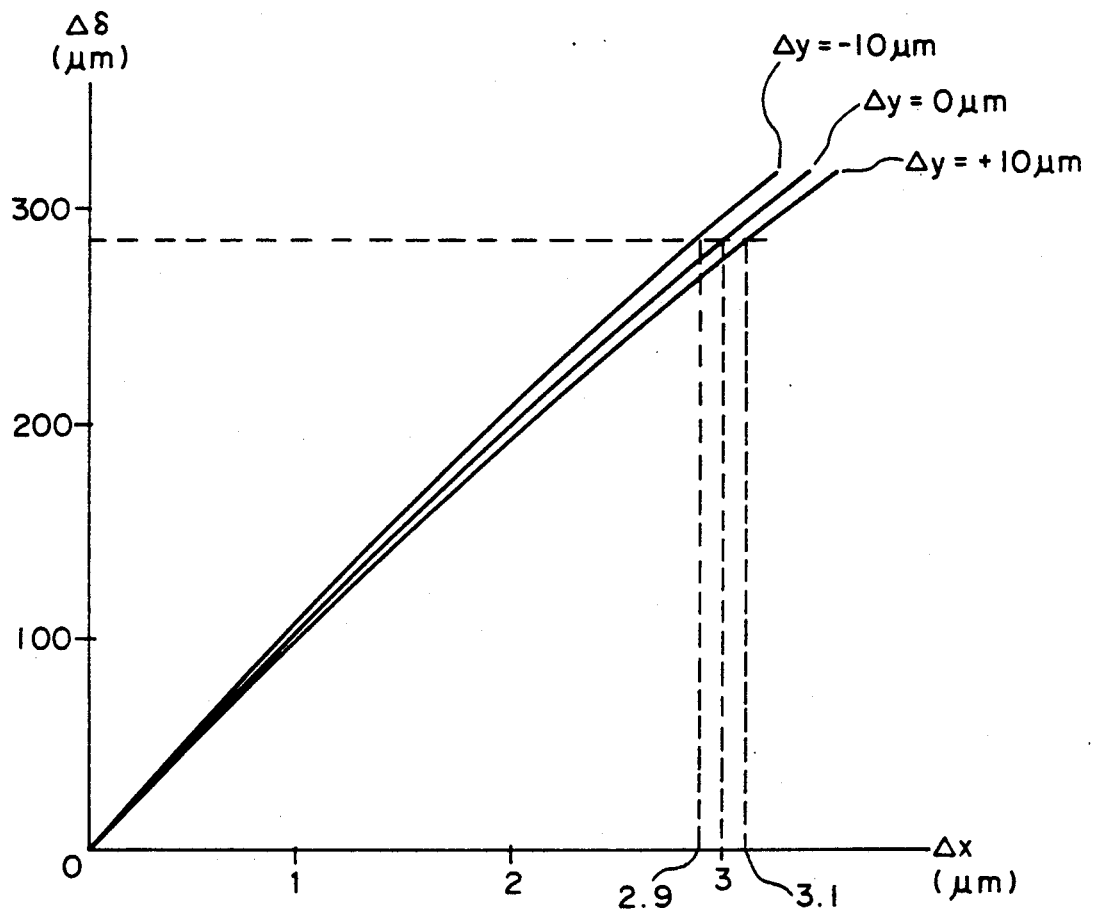
F I G. 5

POSITION DETECTING METHOD AND APPARATUS

This application is a continuation of prior application, Ser. No. 07/692,975 filed Apr. 29, 1991, which application is a continuation of prior application, Ser. No. 07/403,881 filed Sep. 7, 1989, both now abandoned.

FIELD OF THE INVENTION AND RELATED ART

This invention generally relates to a position detecting method and apparatus suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer.

In exposure apparatuses for use in the manufacture of semiconductor devices, the relative alignment of a mask and a wafer is one important factor with respect to ensuring improved performance. Particularly, for alignment systems employed in recent exposure apparatuses, submicron alignment accuracies or more strict accuracies are required in consideration of the demand for higher degrees of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, an example is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of zeroth order transmission light and is projected upon the wafer alignment pattern 60a on the wafer 60 surface with its wavefront being unchanged. The incident light is reflectively diffracted by the wafer alignment pattern 60a and then again passes through the mask 68 in the form of zeroth order transmission light, and finally, is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

Accordingly, by memorizing, in advance, the positional relationship between the positional deviation $\Delta\sigma$ of the wafer to the mask and the positional deviation $\Delta\sigma'$ of the spot of the focused light into a memory means, for example, and by detecting the deviation $\Delta\sigma'$ through the detector 82, it is possible to determine the positional deviation $\Delta\sigma$ of the mask and the wafer.

In this type of an alignment system, however, if there is a positional deviation between the mask and the wafer in a direction perpendicular to the alignment direction with respect to which the mask and the wafer are going to be aligned, then the following inconveniences arise:

(a) The wavefront aberration due to the zone plate changes.

(b) The effective aperture area changes, resulting in a change in the spot diameter of diffraction light or a change in the intensity of the light spot.

Due to these factors, the amount of deviation $\Delta\sigma'$ of the spot of the focused light which should correspond only to the positional deviation between the mask and the wafer in the alignment direction, changes to cause degradation of the precision of alignment.

SUMMARY OF THE INVENTION

It is accordingly an object of the present invention to provide a position detecting method and apparatus by which the measurement of relative positional deviation between first and second objects is less affected by any positional deviation therebetween in a direction perpendicular to the direction with respect to which the relative positional deviation should be detected, such that the relative positional deviation of the first and second objects can be detected with high precision and very easily.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B are schematic representations, showing optical paths related to a light flux 10a.

FIG. 5 is a graph showing the relationship of the positional deviation $\Delta x$, $\Delta y$ with the positional deviation $\Delta \delta$ of the center of gravity of light in the plane of a signal light detection surface.

DESCRIPTION OF THE PREFERRED EMBODIMENTS

Figure 1:
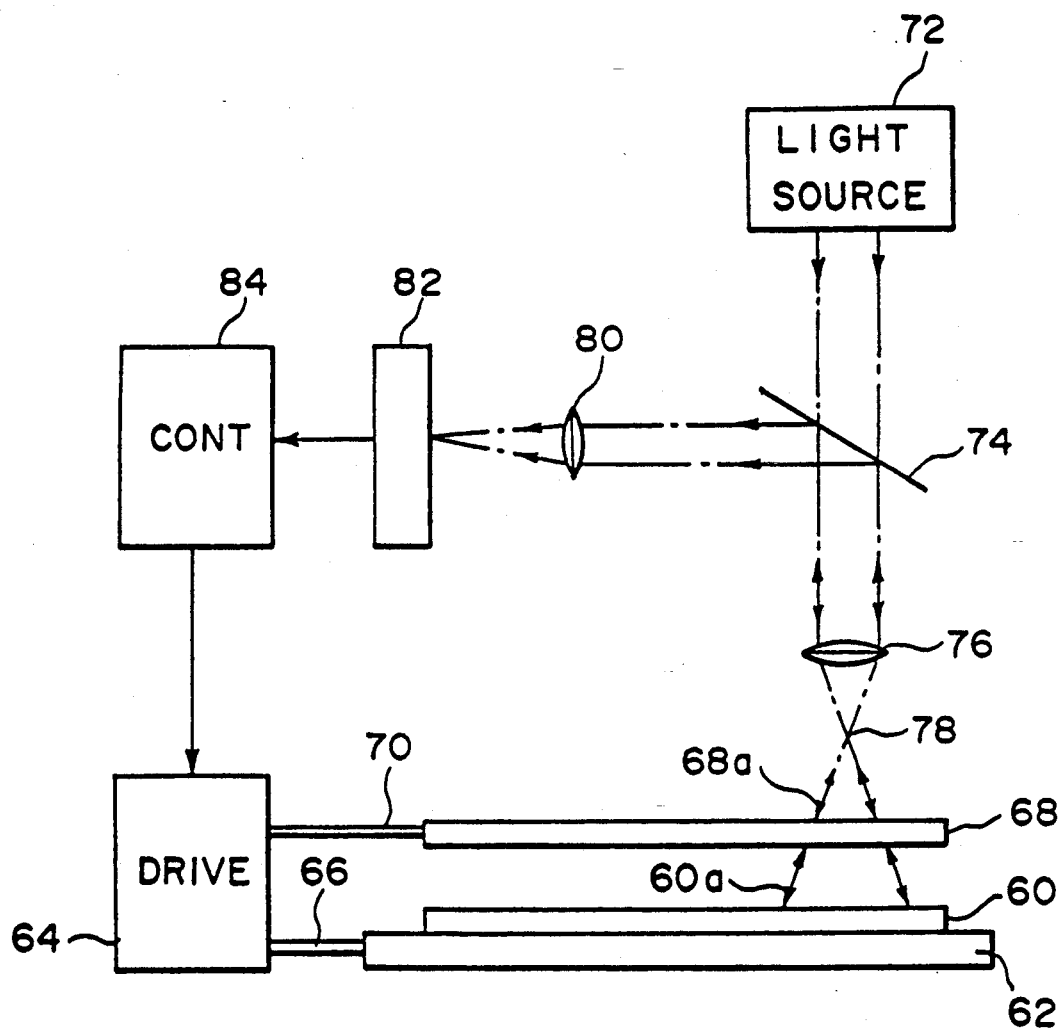
FIGS. 1 and 2 are schematic representations, illustrating a known type alignment system.
Figure 2:
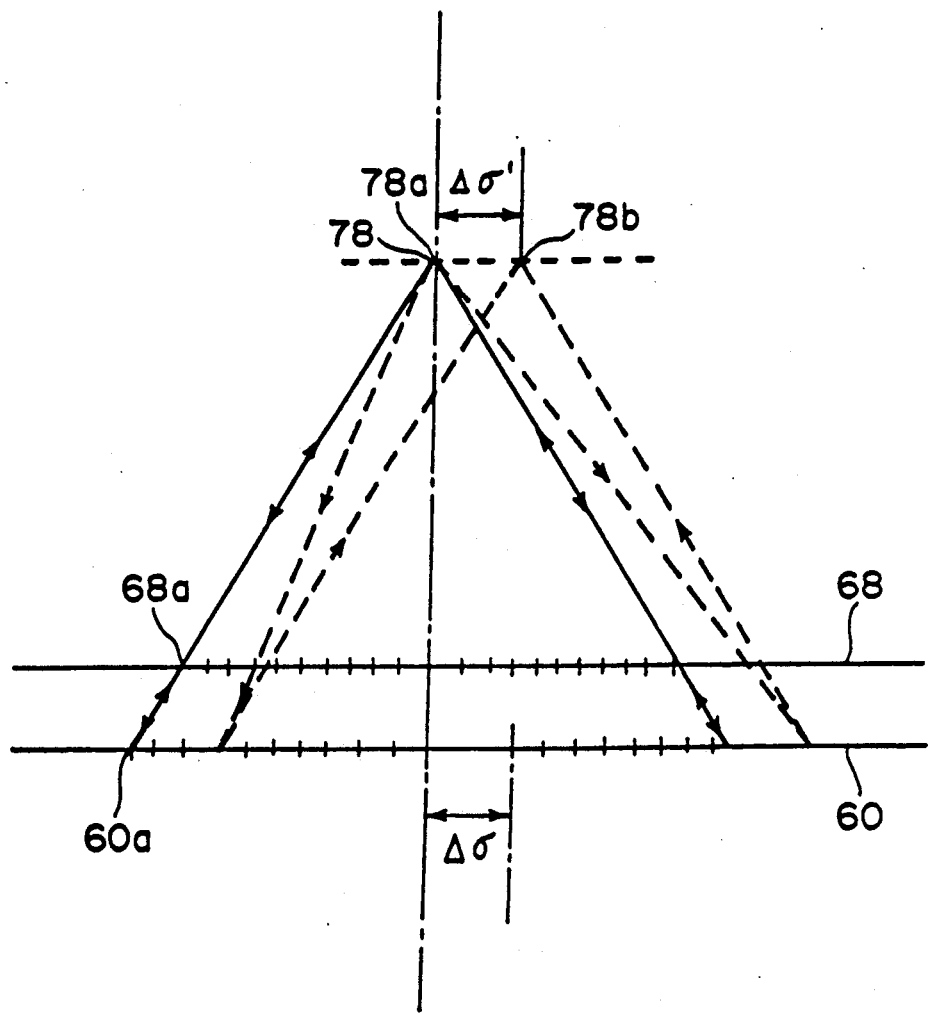
Figure 3:
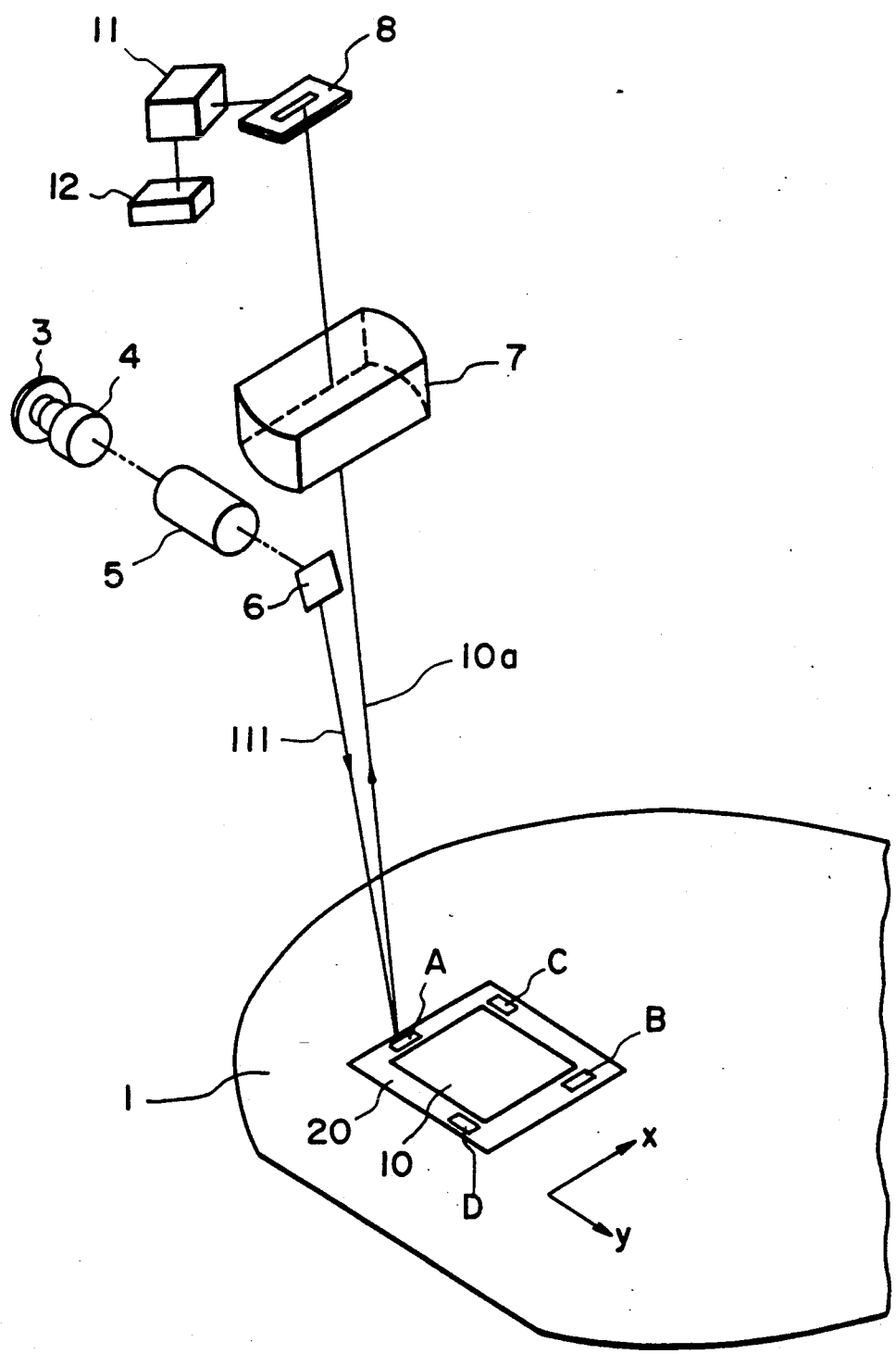
FIG. 3 is a schematic representation, illustrating a major part of a position detecting apparatus according to a first embodiment of the present invention.

FIG. 3 is a schematic representation, illustrating a major part of one embodiment of the present invention. In FIG. 3, light emanating from a light source 3 such as a semiconductor laser, for example, is collimated into parallel light by means of a collimator lens 4. The parallel light is converged by a beam reducing projection lens 5 which is used, as required, for optimizing the spot diameter to be formed on a mask 1 surface. Then, the light is deflected by a deflecting mirror 6 to be projected upon a first physical optic element which is provided in a portion of the surface of a first object 1 such as a mask, for example. Diffraction light of a predetermined order or orders from the first physical optic element on the first object 1 is inputted to a second physical optic element which is provided in a portion of the surface of a second object 2 which is a wafer, for example. The inputted light is diffracted by the second physical optic element and the thus produced diffraction light is collected as a signal light by a light receiving lens 7. Then, by using a photodetector 8, the position of the center of gravity of this signal light is detected. Here, the term "center of gravity of light" means such a point that, when in the plane of the light detecting surface a position vector of each point in the plane is multiplied by the light intensity on that point and the thus obtained products are integrated over the entire plane, the integrated value has a "zero vector".

Computing means 11 serves to compute the amount of deviation, by using a signal from the photodetector 8 and a reference signal from a memory means 12, which will be described later.

In this embodiment, as the first and second physical optic elements, grating lenses such as Fresnel zone plates, for example, are used.

Figure 4A:
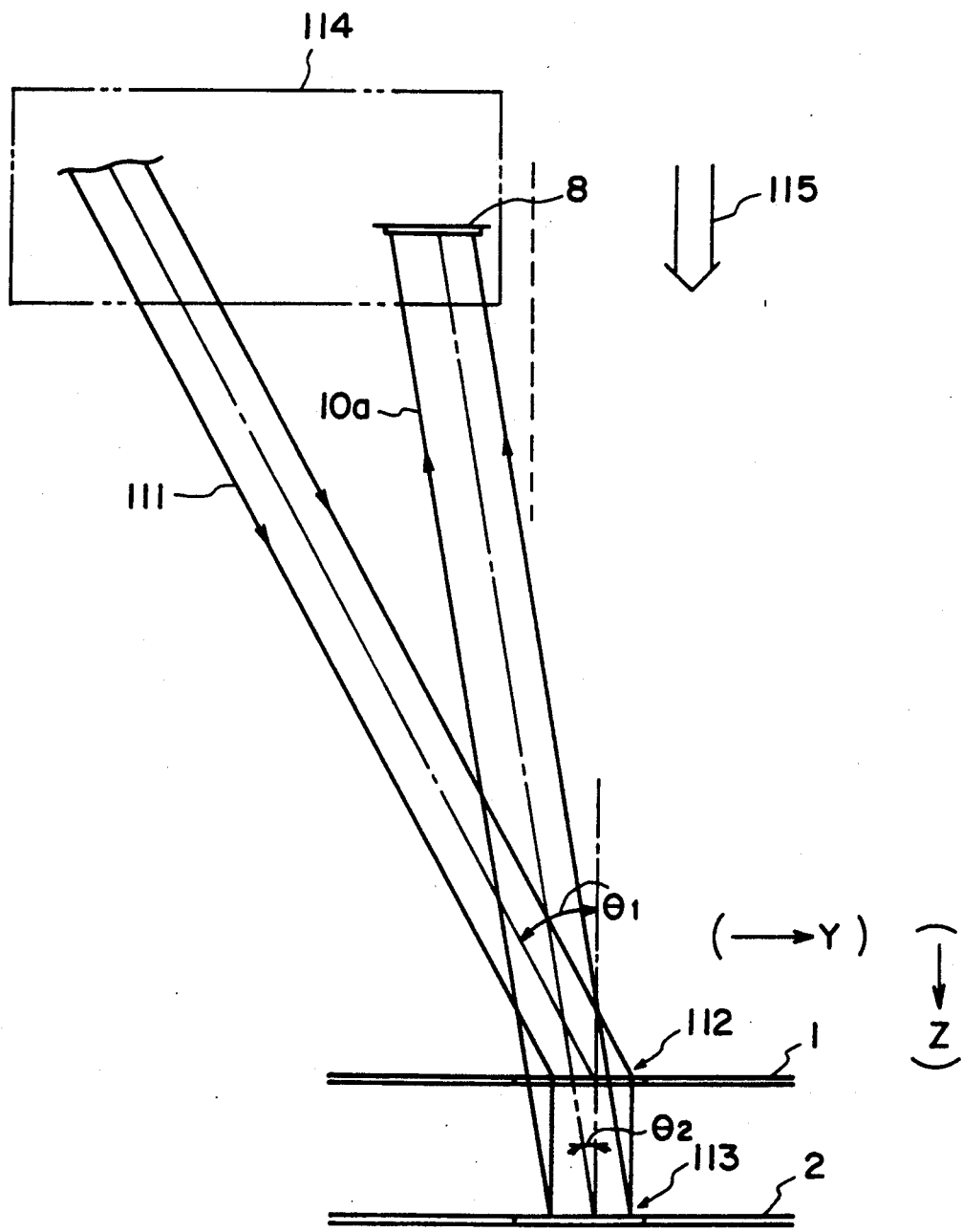
Figure 4B:
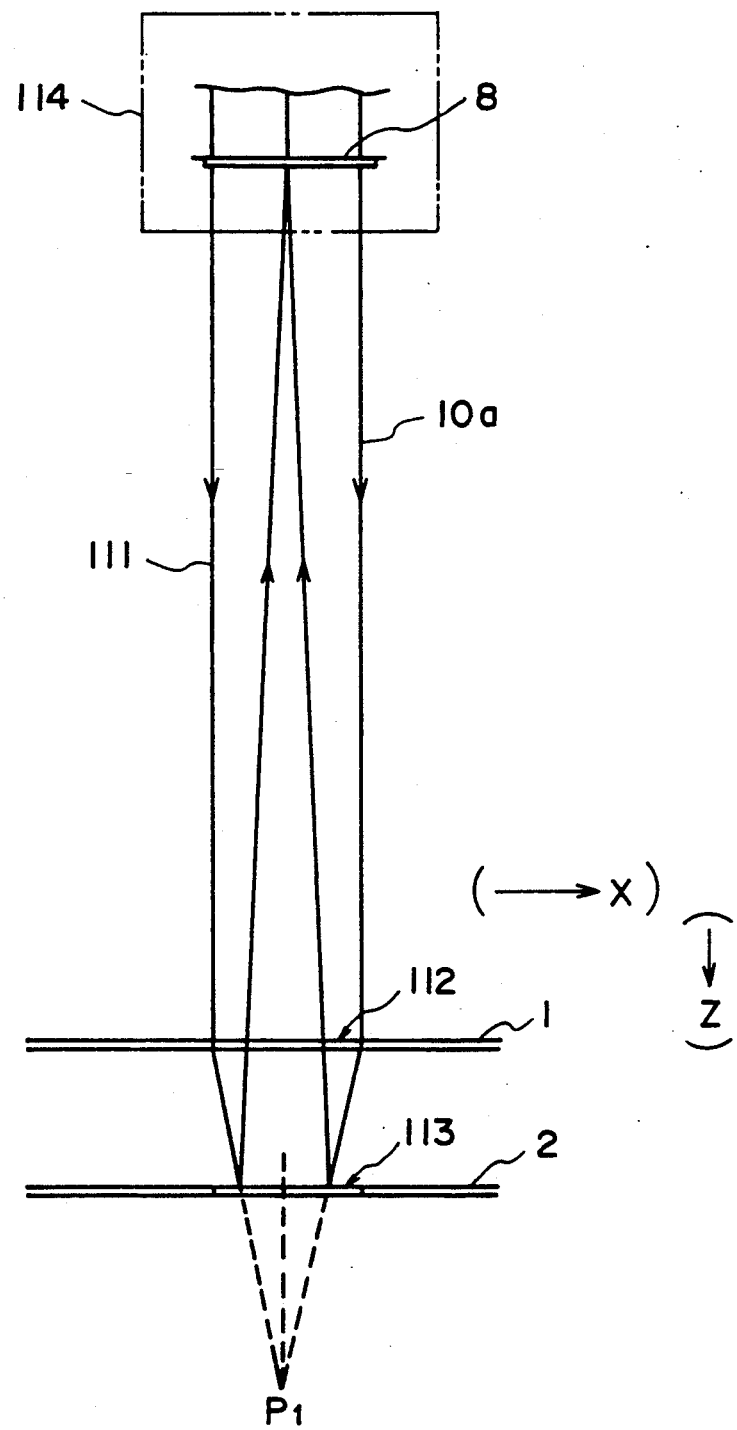

FIGS. 4A and 4B schematically illustrate a path of light 111 which, in this embodiment, emanates from the light source 3 and is incident on the first object 1 and which, after being diffracted, is incident on the second object 2 and, finally, is reflectively diffracted toward a light receiving surface 8.

In the illustrated example, what is to be detected is the amount of positional deviation between a mask (first object) 1 and a wafer (second object) 2 in the X direction.

The light 111 from the light source 3 is projected on the surface of a first off-axis type grating element 112 (first physical optic element) provided in a portion of the mask 1, with an angle $\theta_1$ of incidence with respect to a normal to the mask 1 surface. Diffraction light of a predetermined order or orders from the grating element 112 emanates perpendicularly from the mask 1 and impinges on a second off-axis type grating element 113 (second physical optic element) provided in a portion of the wafer 2.

Here, the term "off-axis type grating element" means such an element wherein, when a light having a given angle of inclination with respect to a normal to the plane in which the element is formed is incident on the element, the property of the element is assured with respect to light of a particular order or orders other than the order of specularly reflected light or rectilinearly transmitted light.

The first off-axis type grating element 112, in this embodiment, comprises a zone plate which is adapted to form a one-dimensional image with a light focused at a finite focal distance in the plane of the sheet of FIG. 4B (i.e. the X-Z plane), but not focused in the plane of the sheet of FIG. 4A (i.e. the Y-Z plane), with its chief ray extending substantially in the direction of a normal to the mask 1.

On the other hand, the grating element 113 comprises, in this embodiment, a zone plate which is adapted to emit a light (with which an image is formed on the photoreceptor 8 with respect to the plane of the sheet of FIG. 4B), with an angle of emission of $\theta_2$ in the sheet of FIG. 4A with respect to a normal to the wafer 2, with the one-dimensional image formed by the mask 1 being taken as an object point. The reference 10a denotes the light flux to be received.

Namely, in the X-Z plane, the grating elements 112 and 113 can be each treated as a lens. In this embodiment, the grating element 112 can serve as a concave lens while the grating element 113 can serve as a convex lens. If, in this structure, the wafer 2 shifts in the X direction, the angle of emission of the light emanating from the grating element 113 changes, as if axial alignment of a lens in an optical system is destroyed. As a result, there occurs a change in the position of incidence of the light upon the photodetector 8.

Denoted at 114 is an optical pickup casing (alignment head) in which a light source and optical elements (not shown) for providing the light 111 to be projected as described as well as the photoreceptor 8 are accommodated. Denoted 115 is exposure light for transferring a pattern of the mask 1 to the wafer 2, with an illustrated chain line depicting the boundary of the path thereof. As for the exposure light, ultraviolet light, X-rays or otherwise may be used.

When the wafer 2 shifts laterally in the X direction, an illuminance distribution formed on the photoreceptor 8 in the plane of the sheet of FIG. 4B shifts laterally, for the reason described above.

The light flux 10a as depicted in FIGS. 4A and 4B is such light as having been diffractively transmitted through the mask 1 with a predetermined order (e.g. first order) and having been diffractively reflected by the wafer 2 with a predetermined order (e.g., first order) and finally, having been transmitted through the mask 1 with zeroth order. For convenience, hereinafter such light will be referred to as "1-1-0 light". In addition to such 1-1-0 light, there exist many diffraction lights of different orders. Of these lights, such a light flux as having been transmitted through the mask 1 with zeroth order and having been diffractively reflected by the wafer 1 with first order and finally, having been diffractively transmitted through the mask 1 with first order (hereinafter such light will be referred as as "0-1-1 light"), can form a spot on the photoreceptor 8 surface in the neighborhood of a spot provided by the 1-1-0 light. Like the 1-1-0 light (10a), the 0-1-1 light can cause a shift of the position of incidence on the detector 8 as a result of the shift of the wafer 2.

Figure 4C:
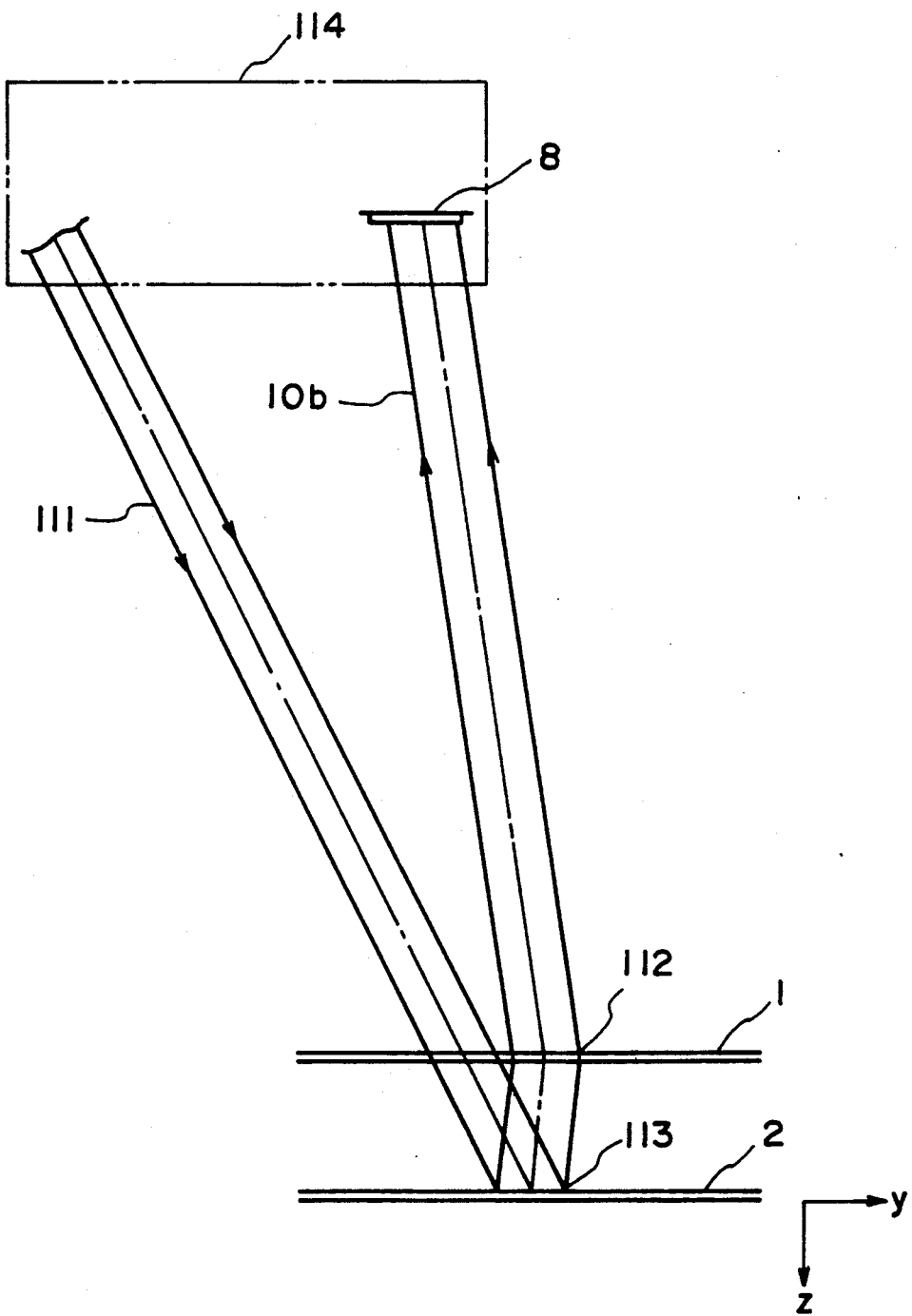
FIGS. 4C and 4D are schematic representations, showing optical paths related to a light flux 10b.
Figure 4D:
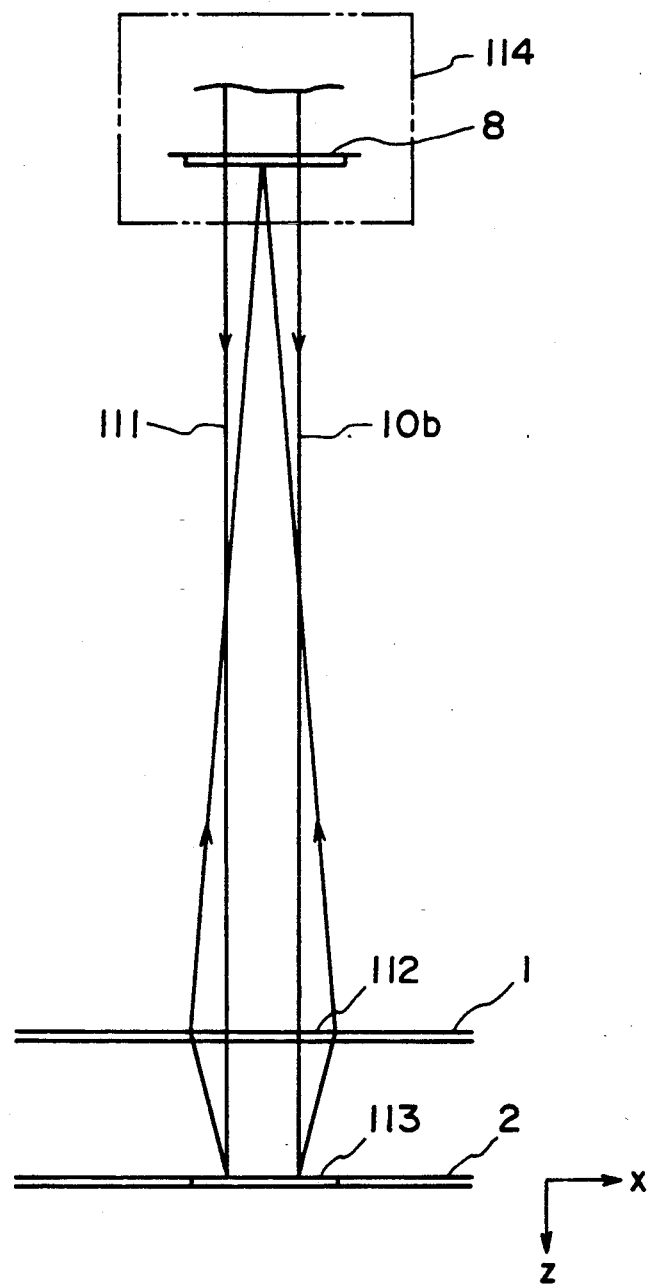

Referring to FIGS. 4C and 4D, the path of such 0-1-1 light is depicted at 10b. When a relative deviation $\Delta\sigma$ of the mask and the wafer in the X direction (alignment direction with respect to which the mask and the wafer should be aligned) is limited within a relatively small range, each of deviations $\Delta\delta 110$ and $\Delta\delta 011$ of respective gravity centers of the 1-1-0 light and the 0-1-1 light, upon the detecting surface 8, is substantially in a linear relationship with the deviation $\Delta\sigma$, because of a paraxial imaging magnification as determined by the refracting power arrangement of the system provided by the two grating elements 112 and 113.

However, with respect to each of the 1-1-0 light and the 0-1-1 light, the corresponding refracting power arrangement is different and, therefore, the imaging magnification is different.

As a result, in the process as illustrated in FIGS. 4A-4D, what is detected may be the position of the center of gravity of two combined two spots whose positions are changeable at different magnifications with a positional deviation $\Delta\sigma$ between the mask and the wafer. Any change in the position of this center of gravity, to be detected, is substantially in a linear relationship with the mask-to-wafer deviation $\Delta\sigma$ and, therefore, by predetecting a proportional constant of the same, it is possible to determine the deviation $\Delta\sigma$ on the basis of the shift of the position of the center of gravity.

More specifically, at the time of mask setting, trial printing may be made to determine, as a reference position, the position of the center of gravity to be defined when the mask and the wafer do not include any positional deviation. At the time of actual position detection, the amount of positional deviation of the center of gravity from the reference position in the X direction may be detected to determine the amount of relative deviation of the mask and the wafer, on the basis of the aforementioned proportional relationship.

In the position detecting process, as described above, if there occurs a positional deviation in a direction perpendicular to the alignment direction (i.e. in the Y direction in FIGS. 4A-4C), because of the difference between the paths of the 1-1-0 light and the 0-1-1 light as illustrated in FIGS. 4A and 4C, there occurs a change in the ratio of the effective aperture areas of these lights. As a result, there occurs a change in the ratio of light quantities of the spots of these lights on the surface of the photoreceptor 8. For this reason, even if the deviations $\Delta\delta 110$ and $\Delta\delta 011$ of the respective gravity centers of these light spots are unchanged with the positional deviation in the Y direction, it is possible that the overall center position of the light changes. This is a factor, in addition to the factors such as a change in the wavefront aberration as described hereinbefore, which causes a possibility of degradation of the alignment precision with respect to the alignment direction due to a positional deviation component in a direction perpendicular to the alignment direction.

In the present embodiment, in order to avoid degradation in precision of the detection of a positional deviation $\Delta x$ in an alignment direction which otherwise might be caused by a positional deviation $\Delta y$ in a direction perpendicular to the alignment direction, the relationship of the deviations $\Delta y$, $\Delta x$ and $\Delta\delta$ is memorized in preparation into a storing means 12 (as will be described later). Making reference to a signal from such a storing means 12, it is possible to attain high-precision alignment in the alignment direction under the influence of the computing means 11.

Details of this alignment method will be explained below.

Usually, in an exposure apparatus for the manufacture of semiconductor devices, physical optic elements such as alignment marks are provided at four sites around an exposure area, for detection of two-dimensional positional deviation (lateral shift and rotational error) between a first object (such as a mask) and a second object (such as a wafer). An example is schematically illustrated in FIG. 3. As shown, alignment marks are provided in four regions A-D which are on a scribe line 20 surrounding an exposure area 10. Each of these alignment marks may comprise an off-axis type grating element as described hereinbefore. As for a light projecting system and a light receiving system, those optical systems such as shown in FIG. 3 may be used.

In this embodiment, with regard to the regions A and B, any deviation in the X direction is detected, while, on the other hand, with regard to the regions C and D, any deviation in the Y direction is detected.

FIG. 5 is an explanatory representation, illustrating the relationship between (i) a positional deviation $\Delta x$ of the mask and wafer in the alignment direction (X direction) in with respect to the regions A and B shown in FIG. 3 and (ii) a deviation $\Delta\delta$ of the center of gravity of a spot on the detecting surface, from a reference position. The illustrated case corresponds to a case wherein the refracting power and arrangement of the grating element (physical optic element) are set so that the deviation $\Delta\delta$ is in a ratio of about 100 to the deviation $\Delta x$. Although, in general, the relationship therebetween is slightly non-linear, because of the aberration of the grating element, for example, this raises substantially no problem with regard to the precision of position detection.

The deviation $\Delta\delta$ corresponds, in principle, to the deviation $\Delta x$ in the alignment direction (X direction). Actually, however, for the reasons described hereinbefore, it can be affected by a positional deviation $\Delta y$ in a direction (Y direction) perpendicular to the alignment direction.

Illustrated in FIG. 5 are three cases where the positional deviation $\Delta y = 0$, $\Delta y = +10$ microns and $\Delta y = -10$ microns. When, as illustrated, there is a positional deviation of an amount of about $\pm 10$ microns in the Y direction, in a region close to a deviation $\Delta x = 3$ microns, there occurs a detection error of about $\pm 0.1$ micron. In the present embodiment, the relationship of the deviations $\Delta x$, $\Delta y$ and $\Delta\delta$ is predetected by experiments, for example, and is memorized in preparation into the storing means 12. In operation, first the amount of deviation $\Delta y$ is detected and then, by making reference to the predetected relationship by using the computing means 11, any error resulting from the positional deviation in the direction (Y direction) perpendicular to the alignment direction is corrected. By this, it is possible to enhance the precision of detection of the positional deviation $\Delta x$ in the alignment direction (X direction). In a particular example, on the basis of the value of $\Delta y$, the proportional constant with regard to the proportional relationship used for calculation of $\Delta x$ from the deviation $\Delta \delta$ may be changed.

As regards the precision for detecting the positional deviation $\Delta y$, it may be relatively low. As an example, in FIG. 5, if the deviation $\Delta y$ can be detected with a precision of $\pm 1$ micron, then the precision of detecting the deviation $\Delta x$ (when it is in a range of $\pm 3$ microns) can be enhanced to about $\pm 0.01$ micron.

The described naturally applies to an occasion when, in FIG. 3, the alignment direction is in the Y direction, with regard to the regions C and D.

Figure 6:
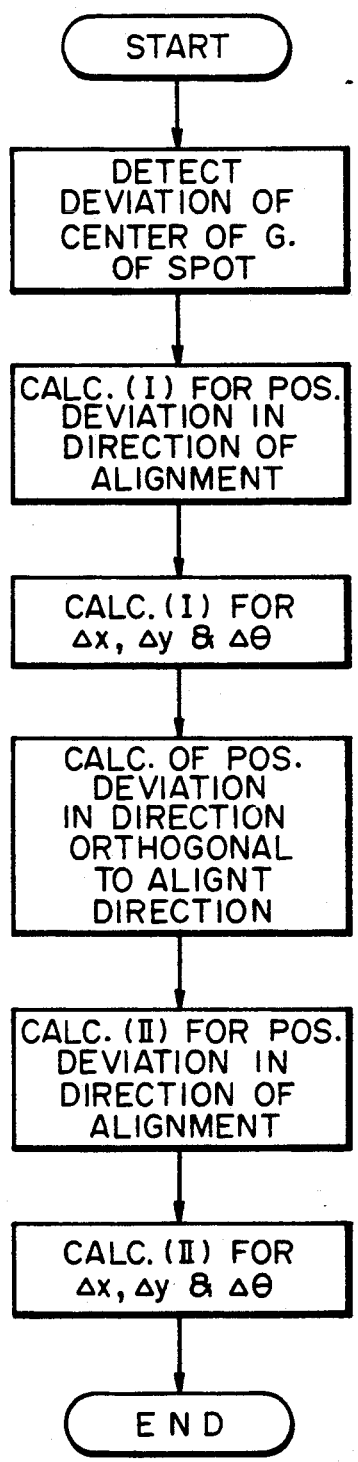
FIG. 6 is a flow chart showing the sequence of deviation detection.

FIG. 6 exemplifies the flow sequence for detecting lateral deviations $\Delta X$ and $\Delta Y$ of a mask and a wafer in the X and Y directions as well as a rotational error $\Delta \theta$ therebetween, by using the computing means 11 and in accordance with the method described hereinbefore. Details of the sequential operations will now be explained.

(a) By using the photodetector 8, with regard to each of the regions A–D, any deviation $\Delta \delta_A$, $\Delta \delta_B$, $\Delta \delta_C$ or $\Delta \delta_D$ of the center of gravity of the spot of light is detected.

(b) Assuming that the amount of deviation in a direction perpendicular to the alignment direction (i.e. in the Y direction with regard to the regions A and B, whereas it is in the X direction with regard to the regions C and D) is null, positional deviations $\Delta x_A$, $\Delta x_B$, $\Delta y_C$ and $\Delta y_D$ in corresponding alignment directions of these points are calculated.

(c) Then, from the deviations $\Delta x_A$, $\Delta x_B$, $\Delta y_C$ and $\Delta y_D$, the two-dimensional positional error of the mask and the wafer, namely, lateral deviations $\Delta X$ and $\Delta Y$ as well as the rotational error $\Delta \theta$ are calculated.

(d) From the detected deviations $\Delta X$, $\Delta Y$ and $\Delta \theta$, with regard to each point, a positional deviation $\Delta y_A$, $\Delta y_B$, $\Delta x_C$ or $\Delta x_D$ in the direction perpendicular to the corresponding alignment direction, is calculated.

(e) Taking into account the above-described positional deviation in the direction perpendicular to the alignment direction, with regard to each point, a calculation is made again to determine a positional deviation $\Delta x_A'$, $\Delta x_B'$, $\Delta y_C'$ or $\Delta y_D'$ with respect to the corresponding alignment direction.

(f) From the deviations $\Delta x_A'$, $\Delta x_B'$, $\Delta y_C'$ and $\Delta y_D'$, lateral deviations $\Delta X'$ and $\Delta Y'$ as well as rotational error $\Delta \theta'$ are detected.

It is a possible alternative that, in the described sequence, the operations made at the steps (d), (e) and (f) are repeated, with appropriate conditions of convergence being predetermined. This assures further enhancement of the precision.

In accordance with the embodiments described hereinbefore, when a relative positional error between first and second objects is to be detected by using physical optic element means, reference is made to the positional information related to any positional error which is in a direction perpendicular to the alignment direction. This makes it possible to provide an alignment device having a high precision of positional error detection.

The detecting method is not limited to the disclosed one, and various methods can be used with the present invention.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting a positional relationship between first and second objects opposed in an opposing direction, with respect to a first direction perpendicular to the opposing direction, said device comprising:

light source means for projecting light to illuminate the first and second objects;

photodetecting means for receiving light from the illuminated first and second objects, said photodetecting means comprising means for detecting a position of incidence of the light upon a predetermined plane, which position changes with a change in the positional relationship between the first and second objects with respect to the first direction and with respect to a second direction which is perpendicular to both the opposing direction and to the first direction;

position detecting means for detecting the positional relationship between the first and second objects, with respect to the second direction; and means for determining the positional relationship between the first and second objects with respect to the first direction, on the basis of the detection by said photodetecting means and by said position detecting means.

2. A device for detecting a positional relationship between first and second objects opposed in an opposing direction, with respect to a first direction perpendicular to the opposing direction, said device comprising:

light source means for projecting light to illuminate the first and second objects;

a first sensor comprising a light receiving surface for receiving first light from the illuminated first and second objects, said first sensor detecting a position of incidence of the received first light upon said first light receiving surface, which position changes with a change in the positional relationship between the first and second objects with respect to the first direction and with respect to a second direction which is perpendicular to both the opposing direction and to the first direction;

a second sensor comprising a second light receiving surface for receiving second light, different from the first light, from the illuminated first and second objects, said second sensor detecting a position of incidence of the received second light upon said second light receiving surface, which position changes with a change in the positional relationship between the first and second objects, with respect to the second direction; and determining means for determining the positional relationship between the first and second objects with respect to the first direction, on the basis of the detection by said first and second sensors.

3. A device according to claim 2, said determining means further comprising means for determining the positional relationship between the first and second objects with respect to the second direction, on the basis of the detection by said first and second sensors.

4. A method of detecting a positional relationship between first and second objects opposed in an opposing direction, with respect to a first direction perpendicular to the opposing direction, said method comprising the steps of:

projecting light to illuminate the first and second objects;

receiving light from the illuminated first and second objects and detecting a predetermined parameter related to the received light, which parameter changes with a change in the positional relationship between the first and second objects with respect to the first direction and with respect to a second direction, perpendicular to the opposing direction and different from the first direction;

detecting the positional relationship between the first and second objects, with respect to the second direction; and determining the positional relationship between the first and second objects with respect to the first direction, on the basis of the detection of the predetermined parameter and the detection of the positional relationship.

5. In a position detecting method wherein a radiation beam is projected to a mark having an optical power formed on a substrate so that the radiation beam is converged on a predetermined plane and wherein a position of the substrate in a predetermined direction is determined on the basis of a position of the radiation beam on the predetermined plane, the improvement comprising:

determining the position of the substrate in the predetermined direction on the basis of a position of the substrate in a direction perpendicular to the predetermined direction and the position of the radiation beam on the predetermined plane.

6. In a semiconductor device manufacturing method wherein positional deviation between an original including an alignment pattern having an optical power and a substrate including an alignment mark having an optical power is detected with respect to a first direction by using the alignment pattern and the alignment mark and, after correction of the positional deviation, the substrate is exposed to a circuit pattern of the original with radiation, the improvement comprising:

converging a projected radiation beam by the alignment pattern and the alignment mark on a predetermined plane;

detecting the position of the radiation beam on the predetermined plane;

detecting the position of the substrate relative to the original with respect to a second direction perpendicular to the first direction; and detecting the positional deviation between the original and the substrate on the basis of the position of the radiation beam on the predetermined plane and the relative position of the substrate with respect to the second direction.

7. In a semiconductor device manufacturing method wherein positional deviation between an original having first and second alignment patterns and a substrate having first and second alignment marks is detected with respect to each of a first direction and a second direction perpendicular to the first direction by using the first and second alignment patterns and the first and second alignment marks and, after correction of the positional deviation, the substrate is exposed to a circuit pattern of the original with radiation, and wherein the first alignment pattern and the first alignment mark each has an optical power with respect to the first direction, while the second alignment pattern and the second alignment mark each has an optical power with respect to the second direction, the improvement comprising:

converging a projected first radiation beam by the first alignment pattern and the first alignment mark on a first predetermined plane;

detecting the position of the first radiation beam on the first plane;

converging a projected second radiation beam by the second alignment pattern and the second alignment mark on a second predetermined plane;

detecting the position of the second radiation beam on the second plane;

detecting a positional deviation between the original and the substrate with respect to the first direction on the basis of the position of the first radiation beam on the first plane and the position of the second radiation beam on the second plane; and detecting a positional deviation between the original and the substrate with respect to the second direction on the basis of the position of the first radiation beam on the first plane and the position of the second radiation beam on the second plane.

8. In a semiconductor device manufacturing method wherein a radiation beam is projected to a mark having an optical power formed on a substrate so that the radiation beam is converged on a predetermined plane, wherein positional deviation of the substrate in a predetermined direction is determined on the basis of a position of the radiation beam on the predetermined plane, and wherein, after correction of the positional deviation, a circuit pattern is printed on the substrate, the improvement comprising:

determining the position of the substrate in the predetermined direction on the basis of a position of the substrate in a direction perpendicular to the predetermined direction and the position of the radiation beam on the predetermined plane.

9. A position determining method for determining the position of a substrate in a first direction by detecting an alignment mark of the substrate, said method comprising the steps of:

detecting the position of the substrate in a second direction which substantially perpendicularly intersects the first direction; and determining the position of the substrate in the first direction on the basis of the detection of the alignment mark and the detection of the position of the substrate in the second direction.

10. A method according to claim 9, further comprising using a zone plate pattern as the alignment mark.

11. A method according to claim 10, wherein said step of detecting the position of the substrate in the second direction is based on a second mark defined by a second zone plate pattern provided on the substrate.

12. A semiconductor device manufacturing method, wherein the position of a wafer in a first direction is adjusted by using an alignment mark formed on the wafer and then a circuit pattern is printed on the wafer to manufacture a semiconductor device, said method comprising the steps of:

photoelectrically detecting the alignment mark of the wafer;

detecting the position of the wafer in a second direction which substantially perpendicularly intersects the first direction;

determining an error in the position of the wafer in the first direction with respect to a predetermined position, on the basis of the detection of the alignment mark and the detection of the position of the wafer in the second direction; and adjusting the position of the wafer so as to correct the error.

13. A method according to claim 12, further comprising using a zone plate pattern as the alignment mark.

14. A method according to claim 13, wherein said step of detecting the position of the wafer in the second direction is based on a second mark defined by a second zone plate pattern provided on the wafer.

15. An alignment and exposure apparatus for aligning a wafer in a first direction by using an alignment mark of the wafer and for printing a circuit pattern on the aligned wafer, said apparatus comprising:
   illuminating means for illuminating the alignment mark of the wafer;
   signal forming means for photoelectrically converting light from the illuminated alignment mark of the wafer and for forming a signal which is dependent on the position of the wafer in the first direction and the position of the wafer in a second direction which substantially perpendicularly intersects the first direction;
   position determining means for determining the position of the wafer in the first direction on the basis of the signal and the position of the wafer in the second direction;
   means for aligning the wafer in the first direction on the basis of the determination; and
   means for exposing the wafer to the circuit pattern to print the circuit pattern on the wafer.

16. An apparatus according to claim 15, wherein the alignment mark of the wafer comprises a zone plate pattern.

17. An alignment and exposure apparatus for aligning a wafer in first and second orthogonal directions by using first and second alignment marks of the wafer and for printing a circuit pattern on the aligned wafer, said apparatus comprising:
   illuminating means for illuminating the first and second alignment marks of the wafer;
   signal forming means for photoelectrically converting light beams from the illuminated first and second alignment marks of the wafer and for forming first and second signals, respectively, each being dependent on the position of the wafer in the first direction and the position of the wafer in a second direction which substantially perpendicularly intersects the first direction;
   position determining means for processing the first signal in accordance with the second signal to determine the position of the wafer in the first direction and for processing the second signal in accordance with the first signal to determine the position of the wafer in the second direction;
   means for aligning the wafer in the first and second directions on the basis of the determination; and
   means for exposing the wafer to the circuit pattern to print the circuit pattern on the wafer.

18. An apparatus according to claim 17, wherein each of the first and second alignment marks comprise a zone plate pattern.

19. An alignment and exposure apparatus for aligning a wafer in first and second orthogonal directions by using first and second alignment marks of the wafer and first and second alignment patterns of a mask and for exposing the wafer to a circuit pattern of the mark, wherein each of the first alignment mark and the first alignment pattern has an optical power with respect to the first direction and wherein each of the second alignment mark and the second alignment pattern has an optical power with respect to the first direction, said apparatus comprising:
   a first alignment optical system for illuminating the first alignment pattern of the mask and the first alignment mark of the wafer to produce a first light beam influenced by the optical powers of the first alignment pattern and the first alignment mark;
   first signal forming means for photoelectrically converting the first light beam to form a first signal which is dependent on the position of the wafer in the first and second directions;
   a second alignment optical system for illuminating the second alignment pattern of the mask and the second alignment mark of the wafer to produce a second light beam influenced by the optical powers of the second alignment pattern and the second alignment mark;
   second signal forming means for photoelectrically converting the second light beam to form a second signal which is dependent on the position of the wafer in the first and second directions;
   position determining means for processing the first signal in accordance with the second signal to determine the position of the wafer in the first direction and for processing the second signal in accordance with the first signal to determine the position of the wafer in the second direction;
   means for aligning the wafer in the first and second directions on the basis of the determination; and
   means for exposing the wafer to the circuit pattern to print the circuit pattern on the wafer.

* * * * *

UNITED STATES PATENT AND TRADEMARK OFFICE
CERTIFICATE OF CORRECTION

PATENT NO. : 5,148,035
DATED : September 15, 1992
INVENTOR(S) : Jun Hattori, et al.

It is certified that error appears in the above-identified patent and that said Letters Patent is hereby corrected as shown below:

COLUMN 4

Line 67, "wafer 1" should read --wafer 2--.

COLUMN 5

Line 25, "two" (second occurrence) should be deleted.

COLUMN 10

Line 50, "water" should read --wafer--.

COLUMN 12

Line 8, "comprise" should read --comprises--.

Signed and Sealed this

Nineteenth Day of October, 1993

Attest:

BRUCE LEHMAN

*Attesting Officer*    *Commissioner of Patents and Trademarks*